(12) United States Patent
Yang et al.

(10) Patent No.: US 8,476,123 B2
(45) Date of Patent: Jul. 2, 2013

(54) METHOD FOR MANUFACTURING THIN FILM TRANSISTOR ARRAY PANEL

(75) Inventors: Dong-Ju Yang, Seoul (KR); Yu-Gwang Jeong, Yongin-si (KR); Jean-Ho Song, Yongin-si (KR); Ki-Yeup Lee, Yongin-si (KR); Shin-Il Choi, Hwaseong-si (KR); Tae-Woo Kim, Seongnam-si (KR)

(73) Assignee: Samsung Display Co., Ltd., Yongin (KR)

( * ) Notice: Subject to any disclaimer, the term of this patent is extended or adjusted under 35 U.S.C. 154(b) by 232 days.

(21) Appl. No.: 13/109,686

(22) Filed: May 17, 2011

(65) Prior Publication Data

US 2012/0028421 A1     Feb. 2, 2012

(30) Foreign Application Priority Data

Jul. 30, 2010   (KR) .......................... 10-2010-0074233

(51) Int. Cl.
*H01L 21/84* (2006.01)
(52) U.S. Cl.
USPC .................................. 438/158; 257/E21.561
(58) Field of Classification Search
USPC ........................... 438/151–166; 257/E21.561
See application file for complete search history.

(56) References Cited

U.S. PATENT DOCUMENTS

| | | | |
|---|---|---|---|
| 6,783,695 B1 | 8/2004 | Torek et al. | |
| 6,841,431 B2 | 1/2005 | Lee et al. | |
| 7,553,708 B2 * | 6/2009 | Ahn et al. | 438/149 |
| 7,563,627 B2 * | 7/2009 | Cho et al. | 438/30 |
| 2004/0198046 A1 | 10/2004 | Yu-Chou et al. | |

FOREIGN PATENT DOCUMENTS

| | | |
|---|---|---|
| JP | 10-004197 | 1/1998 |
| JP | 11-345874 | 12/1999 |
| JP | 2005-317949 | 11/2005 |
| JP | 2006-279059 | 10/2006 |
| JP | 2007-140556 | 6/2007 |
| JP | 2008-262942 | 10/2008 |
| JP | 2009-081422 | 4/2009 |
| KR | 10-2003-0049865 | 6/2003 |
| KR | 10-2006-0112865 | 11/2006 |
| KR | 10-2008-0003118 | 1/2008 |
| KR | 10-2008-0035150 | 4/2008 |
| KR | 10-2008-0041333 | 5/2008 |
| KR | 10-0905052 | 6/2009 |

* cited by examiner

*Primary Examiner* — Richard Booth
(74) *Attorney, Agent, or Firm* — H. C. Park & Associates, PLC

(57) ABSTRACT

A method for manufacturing a thin film transistor array panel includes forming a gate line; forming an insulating layer on the gate line; forming first and second silicon layers first and second metal layers; forming a photoresist pattern having first and second portions; forming first and second metal patterns by etching the first and second metal layers; processing the first metal pattern with $SF_6$ or $SF_6$/He; forming silicon and semiconductor patterns by etching the second and first silicon layers; removing the first portion of the photoresist pattern; forming an upper layer of a data wire by wet etching the second metal pattern; forming a lower layer of the data wire and an ohmic contact by etching the first metal and amorphous silicon patterns; forming a passivation layer including a contact hole on the upper layer; and forming a pixel electrode on the passivation layer.

28 Claims, 19 Drawing Sheets

METHOD FOR MANUFACTURING THIN FILM TRANSISTOR ARRAY PANEL

CROSS REFERENCE TO RELATED APPLICATION

This application claims priority from and the benefit of Korean Patent Application No. 10-2010-0074233, filed on Jul. 30, 2010, which is hereby incorporated by reference for all purposes as if fully set forth herein.

BACKGROUND OF THE INVENTION

1. Field of the Invention

Exemplary embodiments of the present invention relate to a method for manufacturing a thin film transistor array panel.

2. Discussion of the Background

A thin film transistor may be used as a switching device to independently drive a pixel in a flat panel display such as a liquid crystal display or an organic light emitting diode display. A thin film transistor array panel includes thin film transistors connected to signal lines, e.g., gate lines and data lines that respectively transfer scan signals and data signals to the thin film transistor, and a pixel electrode.

As the display area of a thin film transistor array panel increases, the length of the signal line also increases. As a result, the signal line should include a low-resistance material. Copper has a low resistance and may overcome this problem.

However, when copper is exposed during a process for forming a contact hole on a passivation layer that protects the thin film transistor or during ashing of a photoresist pattern, the copper may react with material in the passivation layer, the photoresist pattern, or oxygen-containing compounds, thereby forming an impurity. The impurity may hinder etching in subsequent processes or may cause defects such as an electrical short if the copper in the signal line contacts other metal layers.

The above information disclosed in this section is for understanding of the background of the invention, and it may contain information that does not form the prior art.

SUMMARY OF THE INVENTION

Exemplary embodiments of the present invention provide a method for manufacturing a thin film transistor array panel that may minimize the occurrence of impurities due to copper exposure during an etching process.

Exemplary embodiments of present invention also provide a high quality thin film transistor array panel formed by a process that minimizes defects during an etching process due to impurities.

Additional features of the invention will be set forth in the description which follows, and in part will be apparent from the description, or may be learned by practice of the invention.

An exemplary embodiment of the present invention discloses a method for manufacturing a thin film transistor array panel. The method comprises forming a gate line comprising a gate electrode on a substrate; forming a gate insulating layer on the gate line; forming a first amorphous silicon layer, a second amorphous silicon layer, a first metal layer, and a second metal layer on the gate insulating layer; forming a photoresist pattern having a first portion and a second portion on the second metal layer, the thickness of the second portion being greater than the thickness of the first portion; forming a second metal pattern and a first metal pattern by respectively etching the second metal layer and the first metal layer using the photoresist pattern as a mask; processing the first metal pattern with $SF_6$ or a gas mixture comprising $SF_6$ and He; forming an amorphous silicon pattern and a semiconductor pattern by respectively etching the second amorphous silicon layer and the first amorphous silicon layer using the photoresist pattern as a mask; removing the first portion of the photoresist pattern; forming an upper layer of a data wire by wet etching the second metal pattern using the second portion as a mask; forming a lower layer of the data wire and an ohmic contact by respectively etching the first metal pattern and the amorphous silicon pattern using the second portion as a mask; forming a passivation layer comprising a contact hole on the upper layer after removing the second portion; and forming a pixel electrode on the passivation layer, the pixel electrode being connected to the upper layer through the contact hole.

An exemplary embodiment of the present invention also discloses a method for manufacturing a thin film transistor array panel. The method comprises forming a gate line comprising a gate electrode on a substrate; forming a gate insulating layer on the gate line; is forming a first amorphous silicon layer, a second amorphous silicon layer, a first metal layer, and a second metal layer on the gate insulating layer; forming a photoresist pattern having a first portion and a second portion on the second metal layer, the thickness of the second portion being great than the thickness of the first portion; forming a second metal pattern and a first metal pattern by respectively etching the second metal layer and the first metal layer using the photoresist pattern as a mask; forming an amorphous silicon pattern and a semiconductor pattern by respectively etching the second amorphous silicon layer and the first amorphous silicon layer using the photoresist pattern as a mask; removing the first portion of the photoresist pattern; forming an upper layer of a data wire by wet etching the second metal pattern using the second portion as a mask; forming a lower layer of the data wire and an ohmic contact by respectively etching the first metal pattern and the amorphous silicon pattern using the second portion as a mask; forming a passivation layer comprising a contact hole on the upper layer after removing the second portion; and forming a pixel electrode on the passivation layer, the pixel electrode being connected to the upper layer through the contact hole, wherein the removing the first portion uses a gas mixture of $SF_6$ and $O_2$.

An exemplary embodiment of the present invention additionally discloses a method for manufacturing a thin film transistor array panel. The method comprises forming a gate line comprising a gate electrode on a substrate; forming a gate insulating layer on the gate line; forming a first amorphous silicon layer, a second amorphous silicon layer, a first metal layer, and a second metal layer on the gate insulating layer; forming a photoresist pattern having a first portion and a second portion on the second metal layer, the thickness of the second portion being great than the thickness of the first portion; forming a second metal pattern and a first metal pattern by respectively etching the second metal layer and the first metal layer using the photoresist pattern as a mask; forming an amorphous silicon pattern and a semiconductor pattern by respectively etching the second amorphous silicon layer and the first amorphous silicon layer using the second portion as a mask; removing the first portion; cleaning exposed surfaces with a gas mixture comprising $O_2$ and He; forming an upper layer of a data wire by wet etching the second metal pattern using the second portion as a mask; forming a lower layer of the data wire and an ohmic contact by respectively etching the first metal pattern and amorphous silicon pattern using the second portion as a mask; forming a passivation layer comprising a contact hole on the upper layer after removing the second portion; and forming a pixel electrode on the passivation layer, the pixel electrode being connected to the upper layer through the contact hole.

An exemplary embodiment of the present invention further discloses a method of cleaning during manufacture of a thin film transistor array panel. The method comprises providing a gate line on a substrate, a gate insulating layer on the gate line, at least one silicon-containing layer on the gate insulating layer, at least one metal layer on the at least one silicon-containing layer, and a photoresist pattern on the at least one metal layer; forming a metal pattern by etching the at least one metal layer using the photoresist pattern as a mask; exposing the metal pattern to $SF_6$ or a gas mixture comprising $SF_6$ and He; forming a silicon-containing pattern by etching the at least one silicon-containing layer using the photoresist pattern as a mask; removing a first portion of the photoresist pattern; cleaning surfaces that were exposed by removing the first portion with a gas mixture of $SF_6$ and $O_2$; forming a data wire by wet etching the metal pattern using a remaining portion of the photoresist pattern as a mask; forming a semiconductor pattern by etching the silicon-containing pattern using the remaining portion as a mask; forming a passivation layer comprising a contact hole on the data wire after removing the remaining portion; and forming a pixel electrode on the passivation layer, the pixel electrode being is connected to the data wire through the contact hole.

It is to be understood that both the foregoing general description and the following detailed description are exemplary and explanatory and are intended to provide further explanation of the invention as claimed

BRIEF DESCRIPTION OF THE DRAWINGS

The accompanying drawings, which are included to provide a further understanding of the invention and are incorporated in and constitute a part of this specification, illustrate embodiments of the invention and, together with the description, serve to explain the principles of the invention.

Figure 1:
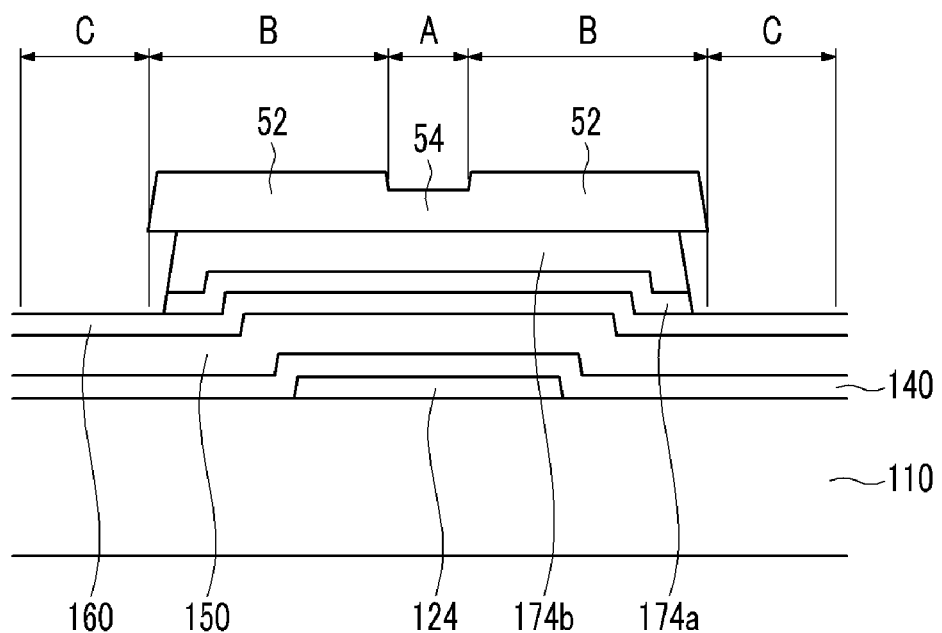
FIG. 1, FIG. 2, FIG. 3, FIG. 4, and FIG. 5 sequentially show cross-sectional views of a thin film transistor during stages of its manufacture according to an exemplary embodiment of the present invention.

DETAILED DESCRIPTION OF THE
ILLUSTRATED EMBODIMENTS

The invention is described more fully hereinafter with reference to the accompanying drawings in which embodiments of the invention are shown. This invention may, however, be embodied in many different forms and should not be construed as limited to the embodiments set forth herein. Rather, these embodiments are provided so that this disclosure is thorough and will fully convey the scope of the invention to those skilled in the art. In the drawings, the size and relative sizes of layers and regions may be exaggerated for clarity Like reference numerals in the drawings denote like elements.

It will be understood that when an element or layer is referred to as being "on," "connected to," or "coupled to" another element or layer, it can be directly on, directly connected to, directly coupled to the other element or layer, or intervening elements or layers may be present. In contrast, when an element is referred to as being "directly on," "directly connected is to," or "directly coupled to" another element or layer, there are no intervening elements or layers present.

FIG. 1, FIG. 2, FIG. 3, FIG. 4, and FIG. 5 sequentially show cross-sectional views of a thin film transistor during stages of its manufacture according to an exemplary embodiment of the present invention.

As shown in FIG. 1, a gate insulating layer 140, a first amorphous silicon layer 150, a second amorphous silicon layer 160, a first conductive layer, and a second conductive layer are stacked on a substrate 110 on which a gate electrode 124 is formed. The second amorphous silicon layer 160 is doped with a conductive impurity, and the first conductive layer 150 may be made of titanium. The second conductive layer 160 may be made of copper.

Thereafter, a photoresist is applied on the second conductive layer 160 and is then exposed and developed, thereby forming photoresist patterns 52 and 54 having different thicknesses. In the photoresist patterns 52 and 54, the gate insulating layer 140, the first amorphous silicon layer 150, the second amorphous silicon layer 160, a first metal layer, and a second metal layer of a portion in which a channel will be formed are referred to as a channel portion A. The gate insulating layer 140, the first amorphous silicon layer 150, the second amorphous silicon layer 160, the first metal layer, and the second metal layer of a portion in which a source electrode and a drain electrode will be formed are referred to as a wire portion B. An area other than the wire portion B and the channel portion A is referred to as the remaining portion C.

In the photoresist patterns 52 and 54, the photoresist 52 positioned in the wire portion B is formed to be thicker than the photoresist 54 positioned in the channel portion A, and all of the photoresist of the remaining portion C is removed. In this configuration, the is thicknesses of the photoresist 52 positioned in the wire portion B and the photoresist 54 positioned in the channel portion A are different according to process conditions in the etching process to be described later. The thickness of the photoresist 54 of the channel portion A may be preferably less than one-half the thickness of the photoresist 52 of the first wire portion.

As such, a method for making the thickness of the photoresist different according to its position may be varied. As an example, a method might include disposing a transparent area, a light blocking area, and a semi-transparent area in an exposure mask. A slit pattern, a lattice pattern, or a mask having an intermediate transmittance or an intermediate thickness is provided in the semi-transparent area. When using the slit pattern, it is preferable that a width of a slit or an interval between the slits is smaller than resolution of an exposing device used in a photolithographic surface process. Another example uses a reflowable photoresist. That is, the reflowable photoresist pattern is formed using the general mask having only the transparent area and the light blocking area. Then the photoresist pattern reflows to flow down into the area in which the photoresist does not remain, i.e., the portion of the photoresist that has been removed, thereby forming the thin portion.

Thereafter, the second metal layer and the first metal layer of the remaining area C are etched using the photoresist patterns 52 and 54 as a mask, thereby forming the first metal pattern 174a and the second metal pattern 174b.

Etching may be a wet etching to create an undercut below the photoresist pattern 52 and 54.

Thereafter, the first pre-processing is performed in order to prevent the side wall of the exposed second metal pattern 174b from corroding. The first pre-processing exposes the second metal pattern 174b to a gas atmosphere. As pre-processing gas, sulfur hexafluoride ($SF_6$) is or a mixture of $SF_6$ and He is used. In this case, pre-processing may be performed for about 10 seconds.

When pre-processing gases $SF_6$ and He are used, the gases do not affect the photoresist patterns 52 and 54 so that the widths and the thicknesses of the photoresist patterns 52 and 54 are not reduced.

Therefore, a portion of the photoresist pattern 54 in which the thickness is thinnest may not be removed by pre-processing gas so as not to expose the lower second metal pattern 174b. The second metal pattern 174b reacts with gas used during subsequent process steps so that an impurity does not occur.

Figure 2:
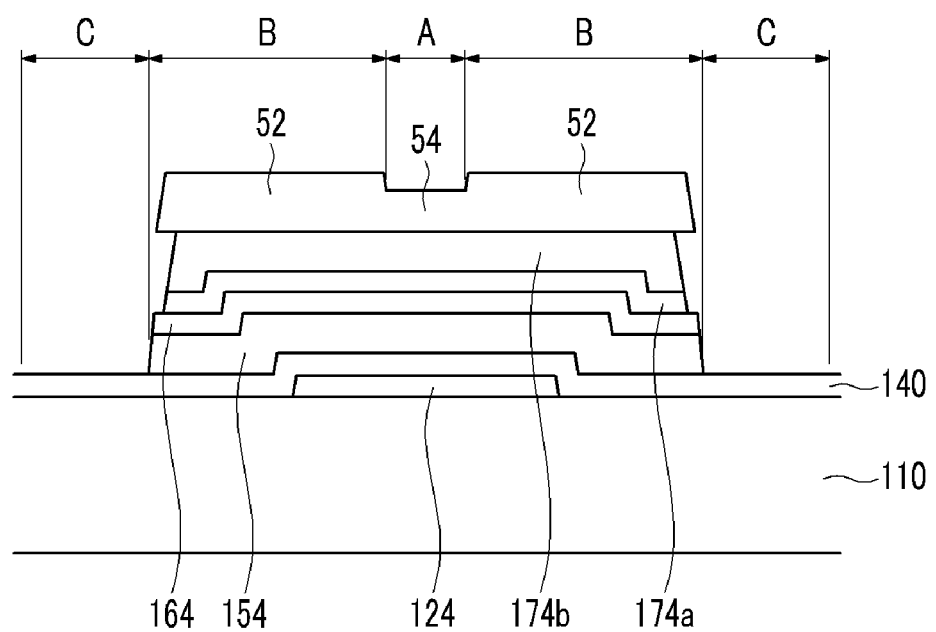

Next, as shown in FIG. 2, the second amorphous silicon layer 160 and the first amorphous silicon layer 150 of the remaining area C are etched using the photoresist patterns 52 and 54 as a mask, thereby forming the amorphous silicon pattern 164 and the semiconductor pattern 154, respectively. In this case, etching may be dry etching.

Figure 3:
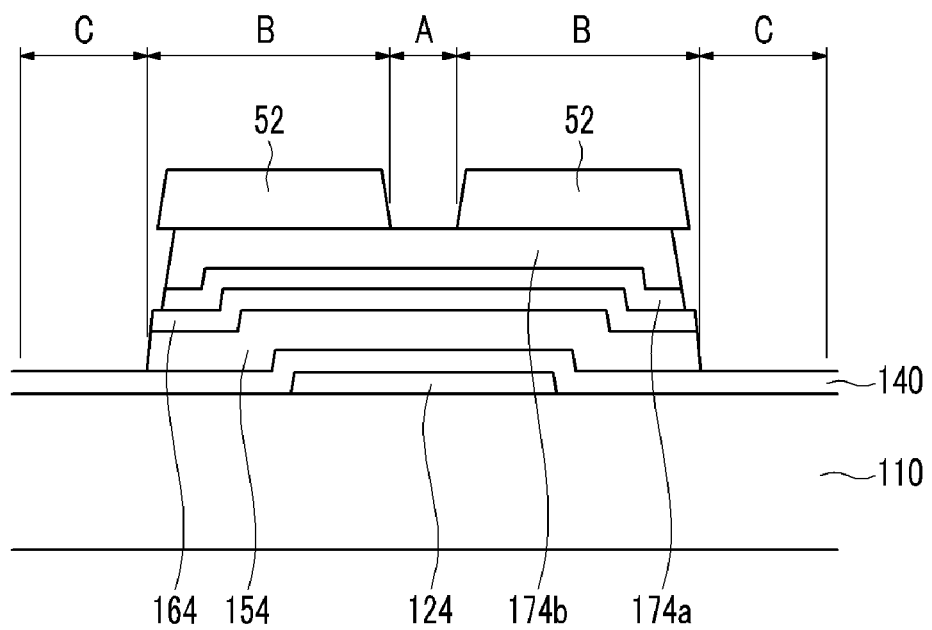

Next, as shown in FIG. 3, the photoresist pattern 54 is removed by an etch back within channel portion A. In this case, the photoresist pattern 52 is partially removed to reduce the thickness and width of the photoresist pattern 52 in the vicinity of the channel portion A.

Thereafter, post-processing is performed to prevent pollution of the channel portion A due to the impurity generated at the time of the etch back procedure. Impurities hinder the etching at the time of post-processing with the result being that etching does not provide the desired pattern. However, in the exemplary embodiment of the present invention, impurities are removed by post-processing, thereby making it possible to minimize the etching defect of the subsequent processes.

Post-processing uses gas mixtures that may contain $SF_6$ and $O_2$, with a ratio of $SF_6:O_2$ being greater than or equal to 1:20 for example. More specifically, the ratio of $SF_6$ to $O_2$ is greater than or equal to 1/20 and less than 1.

Figure 4:
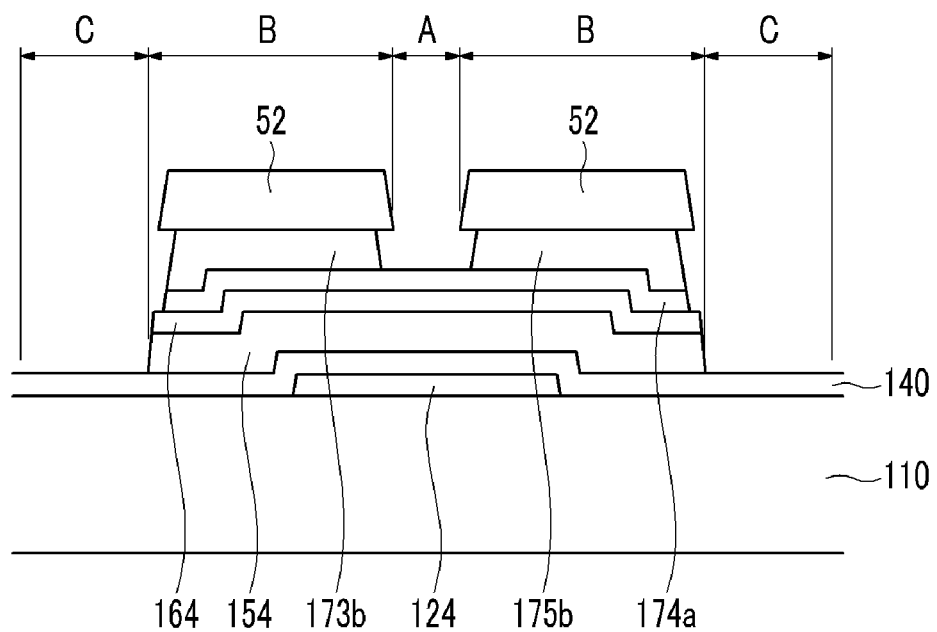

Next, as shown in FIG. 4, upper layers 173b and 175b of a data wire are formed by wet etching the second metal pattern 174b using photoresist pattern 52 as a mask.

Thereafter, a second pre-processing is performed using the same method as the first pre-processing. The second pre-processing may be omitted, if necessary.

Figure 5:
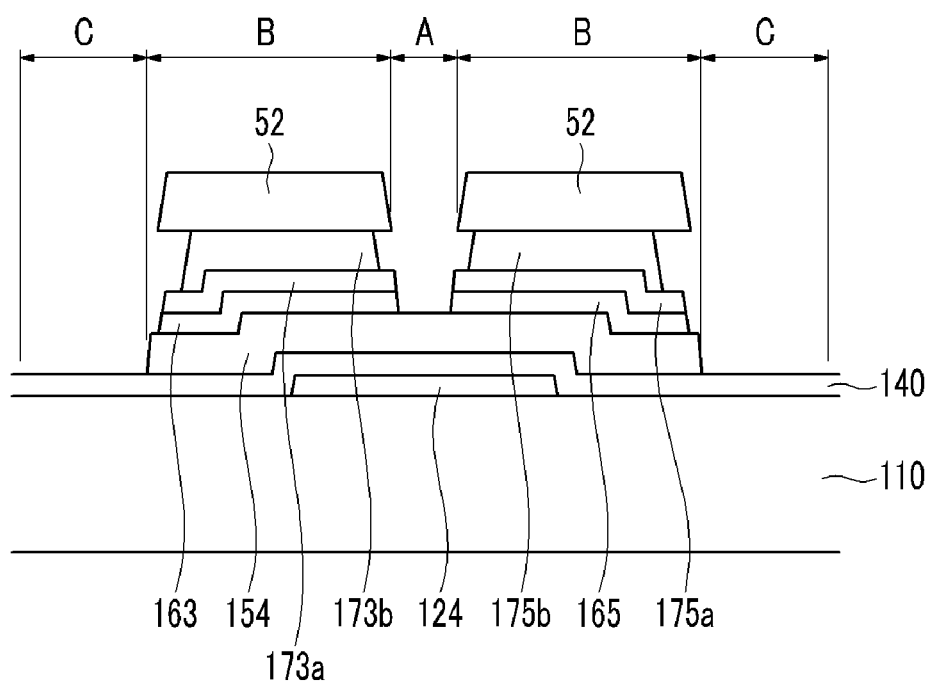

Next, as shown in FIG. 5, the first metal pattern 174a and the amorphous silicon pattern 164 are etched using the photoresist pattern 52 as a mask, thereby forming lower layers 173a and 175a and ohmic contacts 163 and 165 of the data wire.

Figure 6:
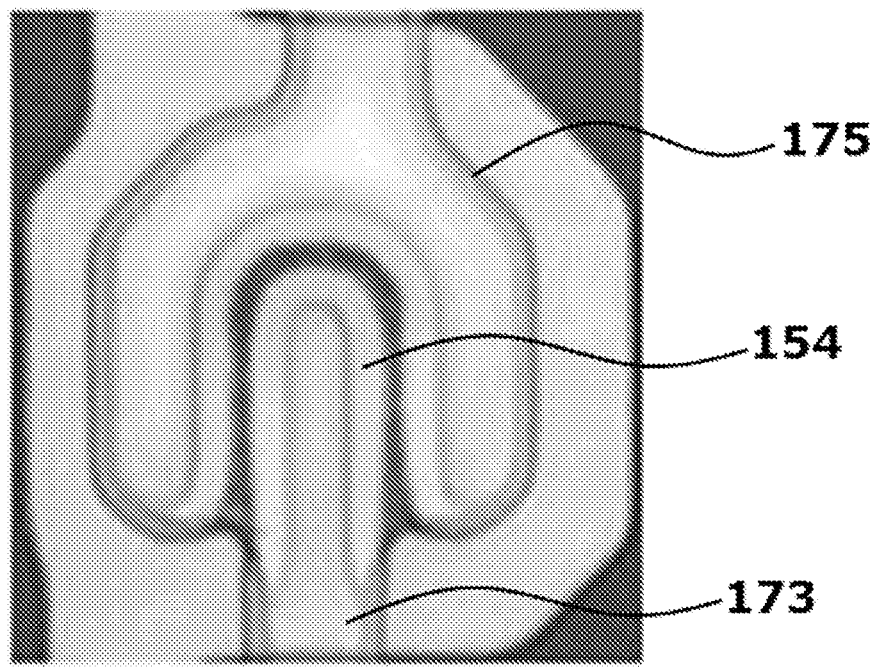
FIG. 6 shows a photograph of a channel unit after pre-processing according to the conventional processing.
Figure 7:
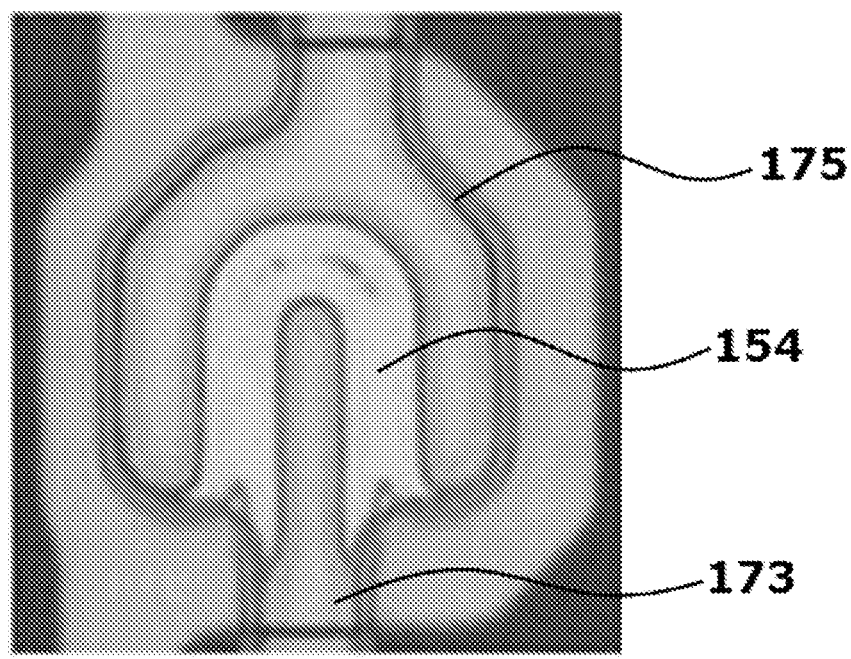
FIG. 7 and FIG. 8 show photographs of a channel unit after pre-processing according to an exemplary embodiment of the present invention.
Figure 8:
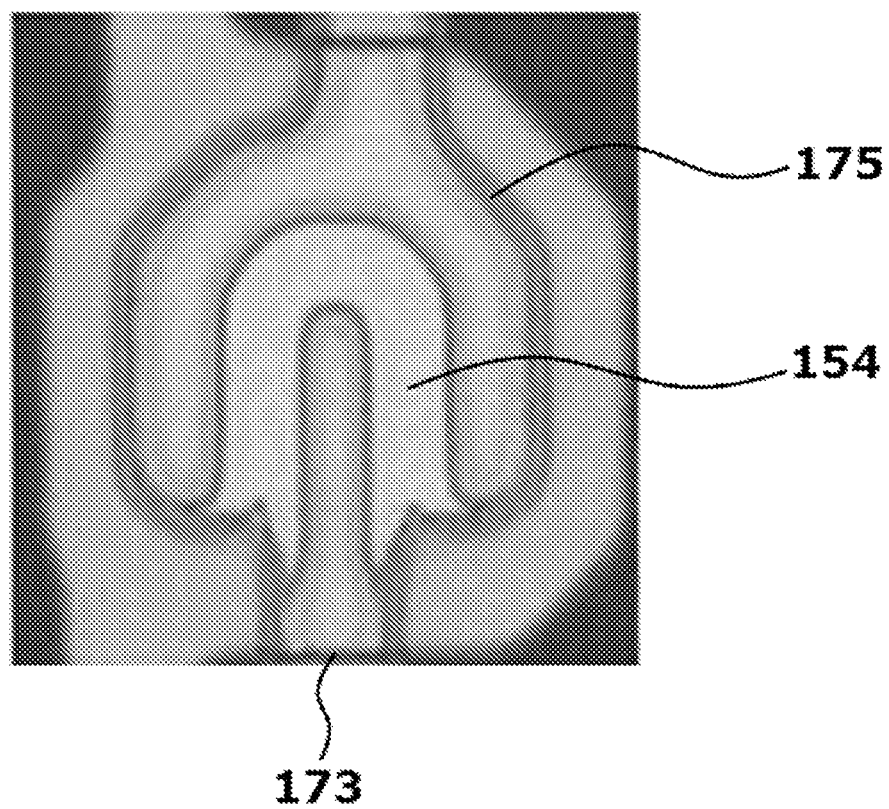

FIG. 6 shows a photograph of a channel unit after pre-processing according to conventional processing. FIG. 7 and FIG. 8 show photographs of the channel unit after pre-processing according to an exemplary embodiment of the present invention.

As shown in FIG. 6, when pre-processing is performed according to conventional processing, impurities are formed in the channel portion as indicated by the dark areas in the channel region between the drain electrode and the source electrode. Impurities are generated by removing the photoresist pattern to expose the lower metal pattern of the channel portion at the time of pre-processing according to conventional processing, which corrodes the exposed lower metal pattern.

However, as shown in FIG. 7 and FIG. 8, when pre-processing is performed by the process of the present exemplary embodiment, practically no impurities remain in the channel portion. That is, pre-processing according to the present exemplary embodiment does not negatively affect the photoresist pattern 52. Therefore, the photoresist pattern 52 is not removed and does not expose the lower metal pattern 173a and 175a. In addition, FIG. 7 shows is a case in which a ratio of $SF_6$ and He is 1:5. As shown in FIG. 8, when the relative amount of He in the gas mixture is increased, e.g. doubled, so that the ratio of $SF_6$:He is changed to 1:10, the removal of the impurity is more efficient as compared with the result of the 1:5 gas mixture used to produce the switching unit shown in FIG. 7.

Figure 9:
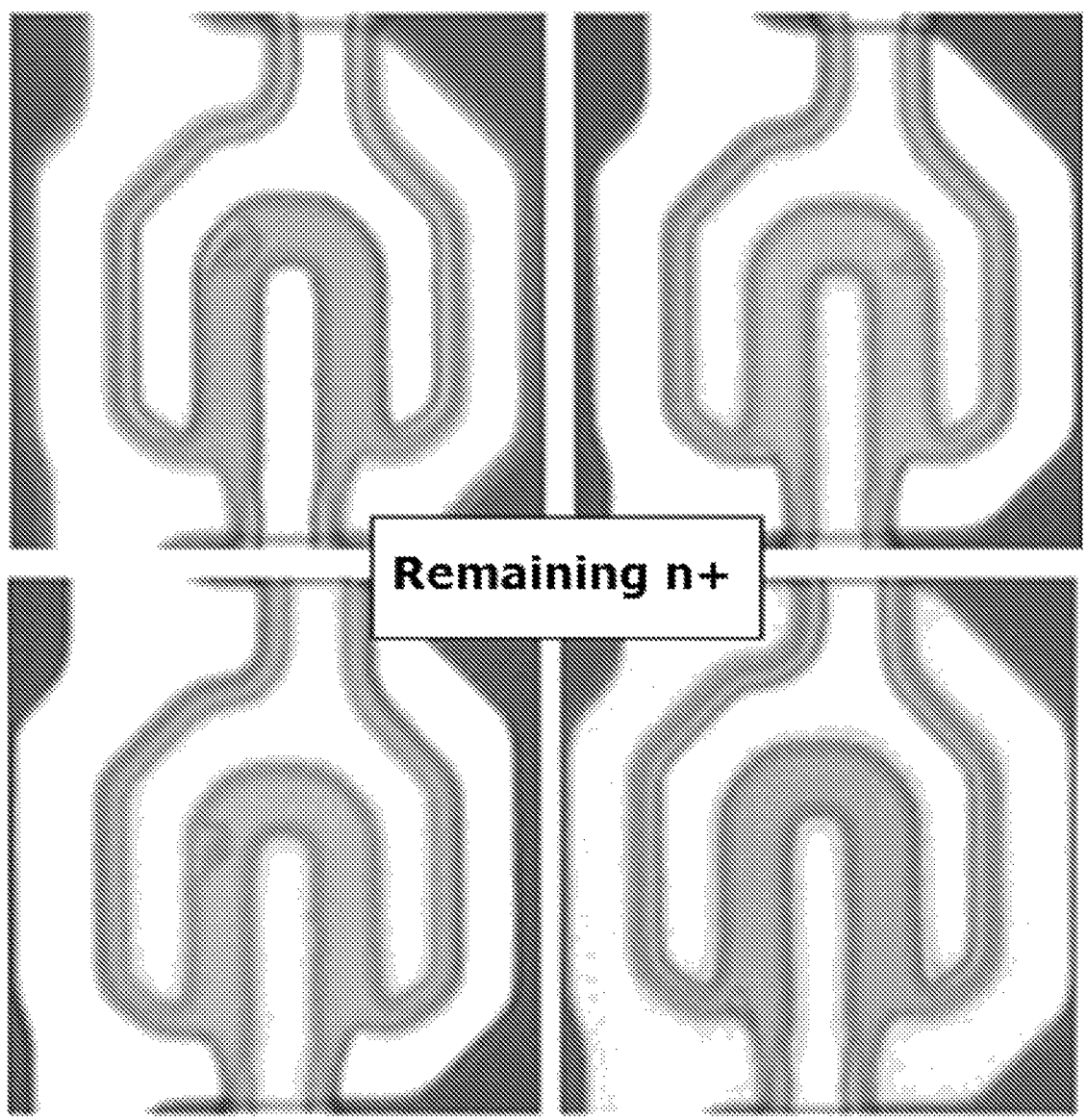
FIG. 9 shows photographs of a channel unit after post-processing according to the conventional processing.
Figure 10:
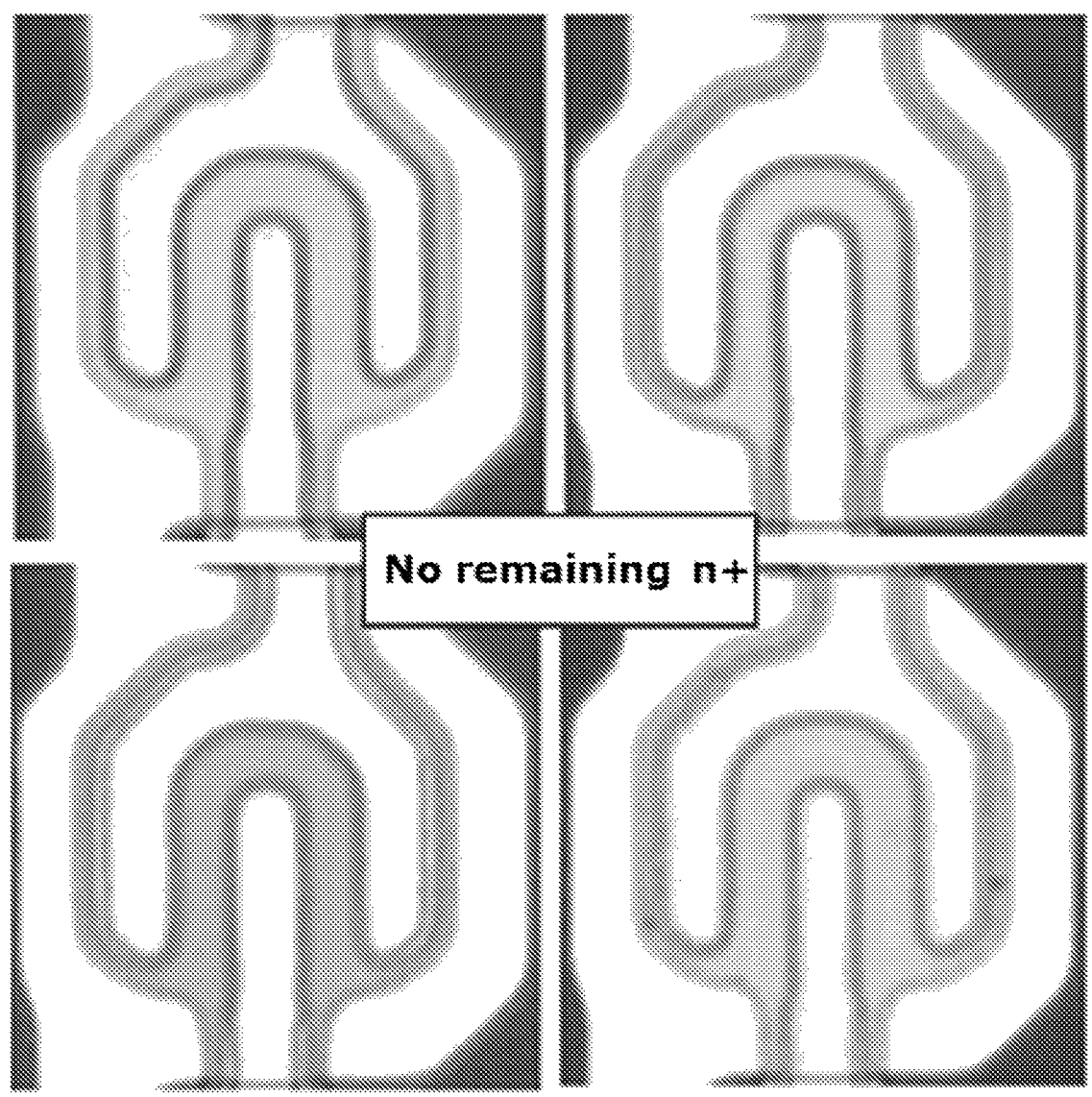
FIG. 10 shows photographs of a channel unit after post-processing according to an exemplary embodiment of the present invention.

FIG. 9 shows photographs of a channel unit after post-processing according to conventional processing, and FIG. 10 shows photographs of a channel unit after post-processing according to an exemplary embodiment of the present invention. In post-processing according to the conventional processing, $SF_6$ and $O_2$ are present in a ratio of 40 sccm:8000 sccm (i.e., 1/200) and in post-processing according to the present exemplary embodiment, the relative amount of $SF_6$ is increased so that the ratio of $SF_6$ and $O_2$ is 400 sccm:8000 sccm (i.e., 1/20).

As shown in FIG. 9, when post-processing according to the conventional processing is performed, the impurity is not completely removed in the channel portion such that portions from the non-etched second amorphous silicon layer remain in the channel region. However, as shown in FIG. 10, when post-processing according to the present exemplary embodiment is performed, the impurity is completely removed in the channel portion such that the second amorphous silicon layer is completely removed.

FIG. 11, FIG. 12, FIG. 13, and FIG. 14 sequentially show cross-sectional views of a thin film transistor during stages of its manufacture according to another exemplary embodiment of the present invention.

Figure 11:
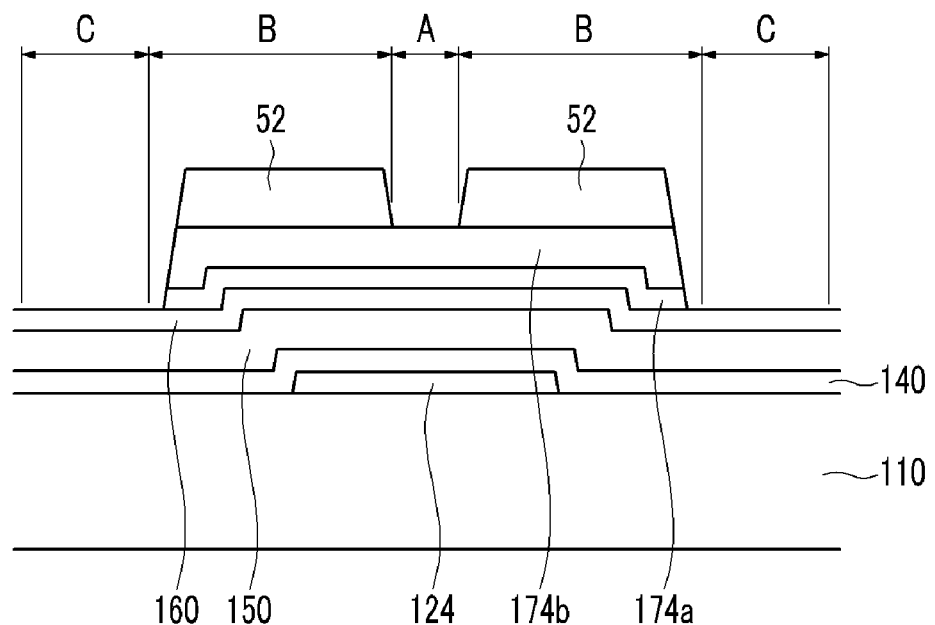
FIG. 11, FIG. 12, FIG. 13, and FIG. 14 sequentially show cross-sectional views of a thin film transistor during stages of its manufacture according to another exemplary is embodiment of the present invention.

First, as shown in FIG. 11, a gate insulating layer 140, a first amorphous silicon layer 150, a second amorphous silicon layer 160, a first conductive layer, and a second conductive layer are stacked on a gate electrode 124 and a substrate 110.

Thereafter, a photoresist is applied on the second conductive layer and is then is exposed and developed, thereby forming photoresist patterns 52 and 54 having different thicknesses. Thereafter, the second metal layer and the first metal layer of the remaining area C are etched using the photoresist patterns 52 and 54 as a mask, thereby forming the second metal pattern 174b and the first metal pattern 174a.

Etching may be a wet etching so that an undercut may be formed below the photoresist pattern.

Thereafter, the first pre-processing is performed to prevent corrosion of the side wall of the exposed second metal pattern 174b. Pre-processing is performed in the same method as the exemplary embodiment used to produce the thin film transistor of FIG. 1.

Next, as shown in FIG. 11, the photoresist pattern of the channel portion is removed by etch back. In this case, the photoresist pattern 52 is partially removed to reduce the thickness and width of the photoresist pattern 52.

Figure 12:
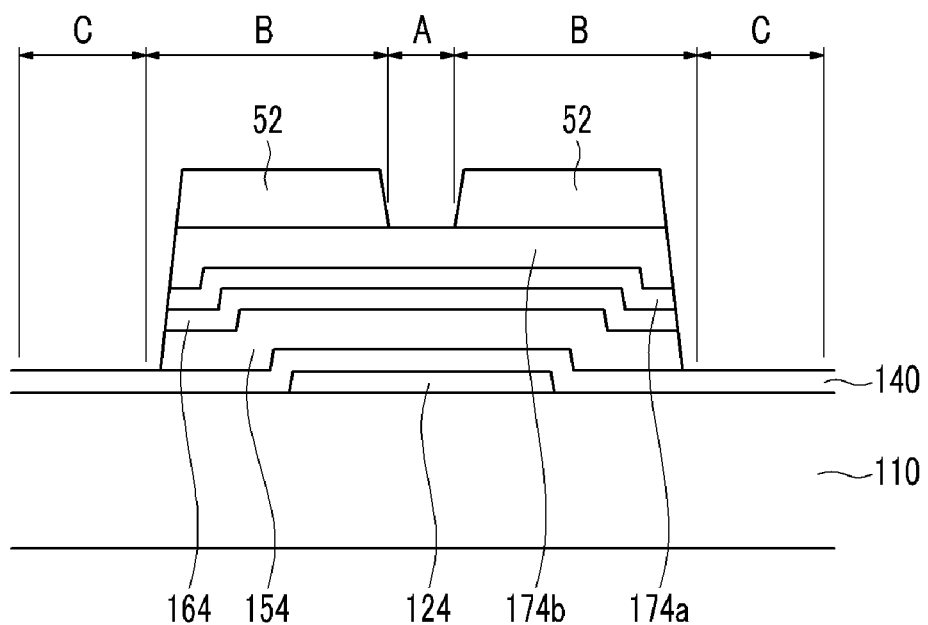

Next, as shown in FIG. 12, the second amorphous silicon layer 160 and the first amorphous silicon layer 150 are etched by using the photoresist pattern 52 as a mask, thereby forming the amorphous silicon pattern 164 and the semiconductor pattern 154.

Figure 13:
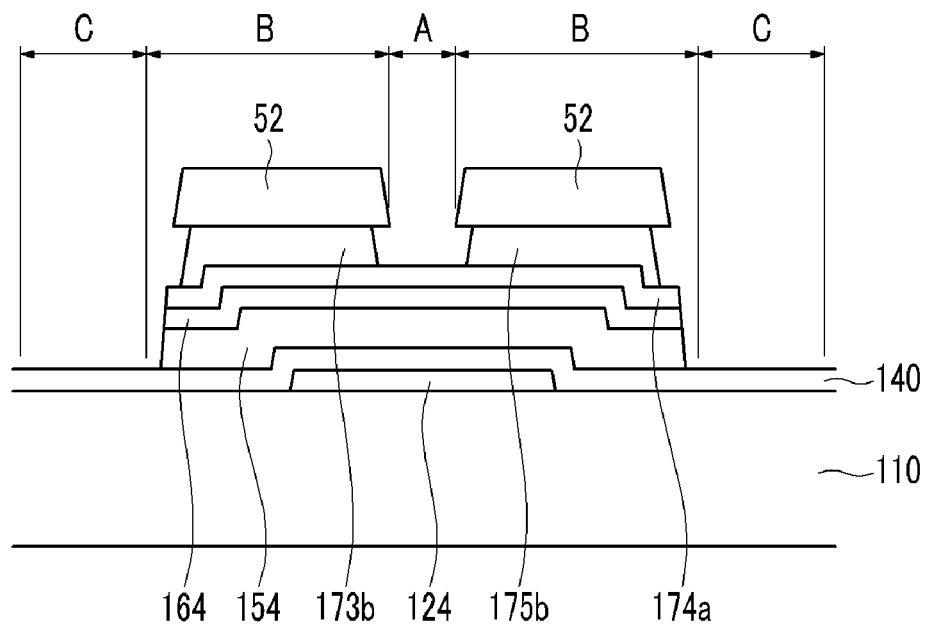

Unlike the first exemplary embodiment, after the etch back is performed, etching is performed by using the photoresist pattern 52 with the reduced width, thereby making it possible to reduce the portion of the semiconductor pattern 154 that protrudes outside the boundary of the first metal pattern 174a. As shown in FIG. 13, when the amorphous silicon pattern 164 is etched before the etch back, the width of the photoresist pattern 52 is larger than that of the first metal pattern 174a by the width of the undercut that is formed below the photoresist pattern 52 by the wet etch. Therefore, when the amorphous silicon pattern 164 is etched using the photoresist pattern 52 as a mask, the semiconductor pattern 154 may protrude is outside the boundary of the first metal pattern 174a, which may generate leakage current due to the light leakage.

However, as shown in FIG. 12, after the etch back is performed, when the etching is performed using the photoresist pattern 52 having the reduced width as a mask, the width difference between the first metal pattern 174a and the photoresist pattern 52 is reduced, and the amorphous silicon pattern 164 is etched using it as a mask, thereby making it possible to reduce the portion of the semiconductor pattern 154 that protrudes outside the boundary of the first metal pattern 174a.

Thereafter, when the amorphous silicon pattern 164 is etched during post-processing, the generated impurity may be removed.

Post-processing may be performed by gas mixture of $O_2$ and He. Post-processing may be performed for about 10 seconds. In this case, $O_2$ is injected with a flow rate ranging from 500 sccm to 15,000 sccm, and He is injected at a flow rate of about 1000 sccm.

Next, as shown in FIG. 13, the upper layers 173b and 175b of the data wire are formed by wet etching of the second metal pattern 174b using the photoresist pattern 52 as the etching mask.

Figure 14:
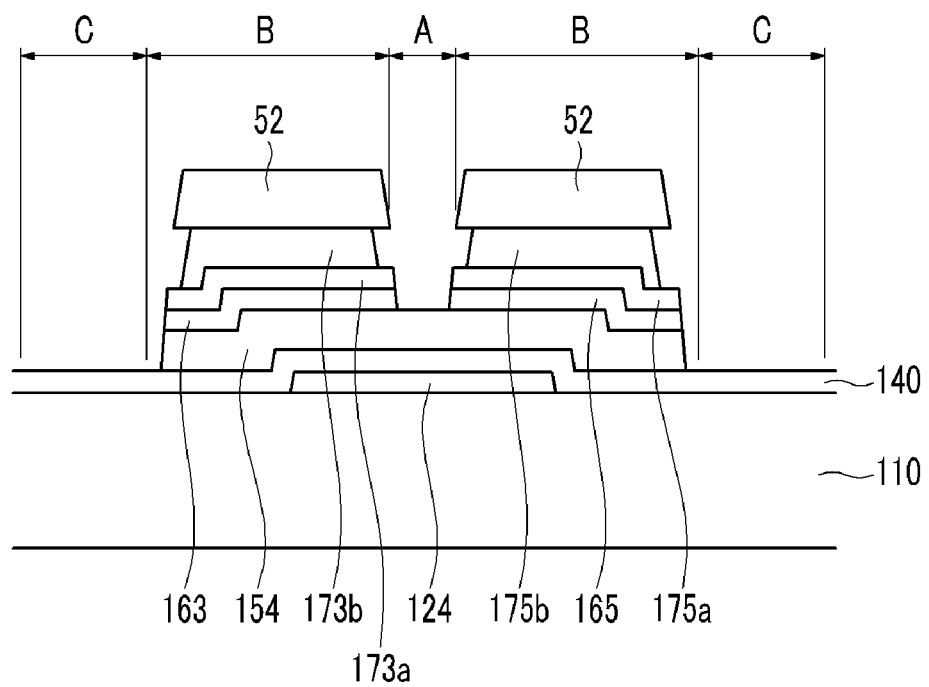

Thereafter, as shown in FIG. 14, the lower layers 173a and 175a of the data wire and the ohmic contacts 163 and 165 are formed by dry etching the first metal pattern 174a and the amorphous silicon pattern 164 using the photoresist pattern 52 as the etching mask.

Figure 15:
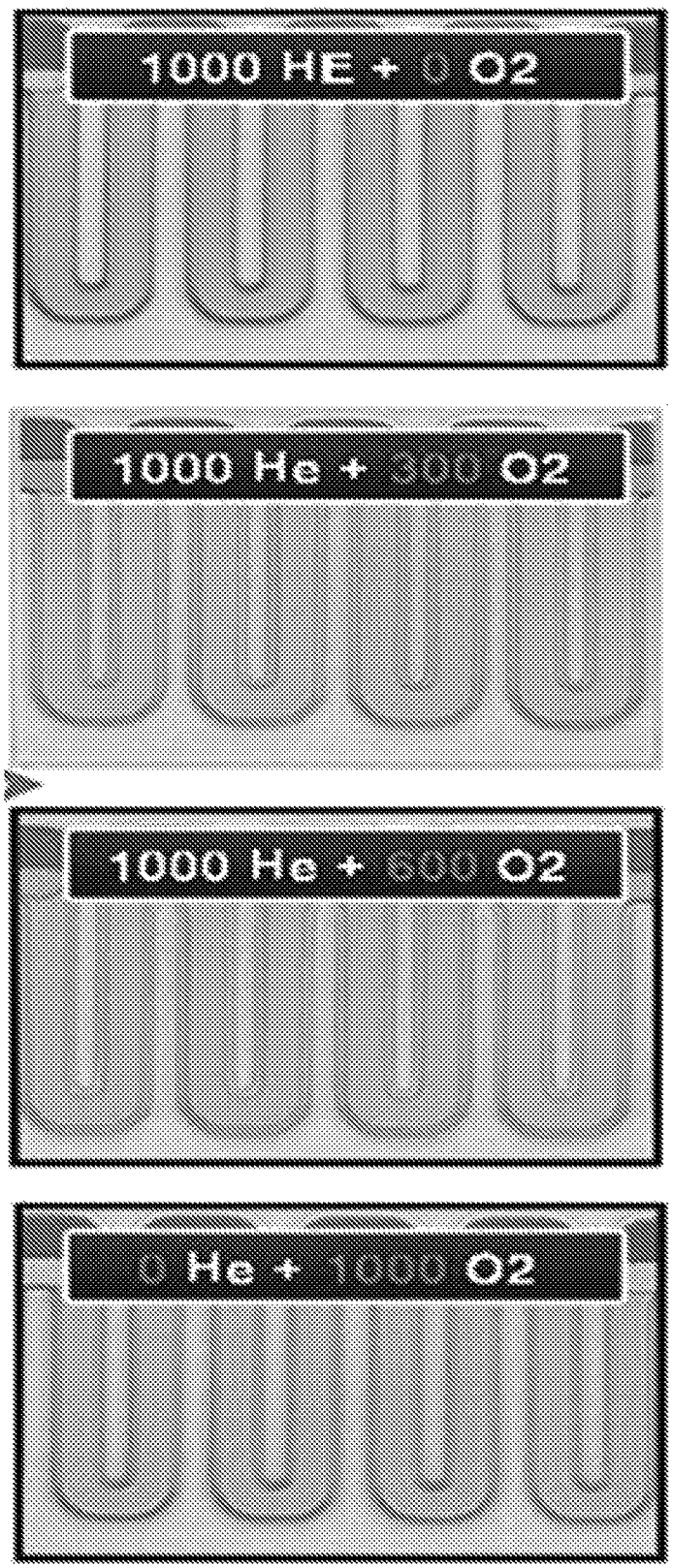
FIG. 15 shows photographs of a channel unit after post-processing according to an exemplary embodiment of the present invention for various gas compositions.

FIG. 15 shows photographs of a channel unit after post-processing according to an exemplary embodiment of the present invention for various gas mixtures.

As shown in FIG. 15, as the He flow is maintained at 1000 sccm and the $O_2$ flow rate is increased from 0 sccm, to 300 sccm, and to 600 sccm, the impurity (the dark material in is the photographs) is removed from the channel portion when $O_2$ is injected into 500 sccm or more. Further, when the $O_2$ flow rate is 1000 sccm in the absence of He, some impurity remains.

A method for forming a thin film transistor array panel using the method for forming the thin film transistor of FIG. 1, FIG. 2, FIG. 3, FIG. 4, and FIG. 5 will be described with reference to FIG. 16, FIG. 17, FIG. 18, FIG. 19, FIG. 20, FIG. 21, FIG. 22, and FIG. 23.

Figure 16:
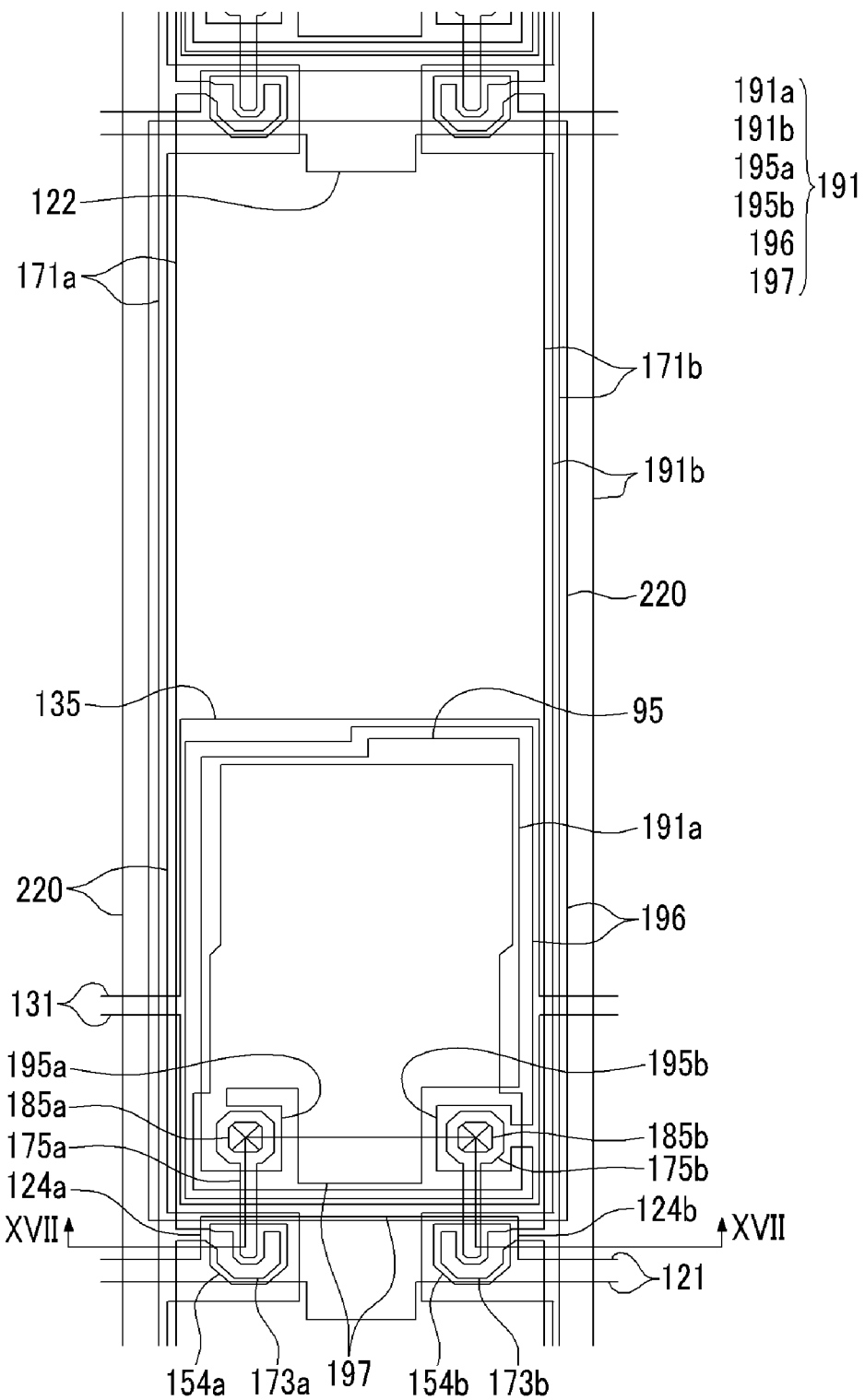
FIG. 16 shows a layout view of a liquid crystal display according to an exemplary embodiment of the present invention.
Figure 17:
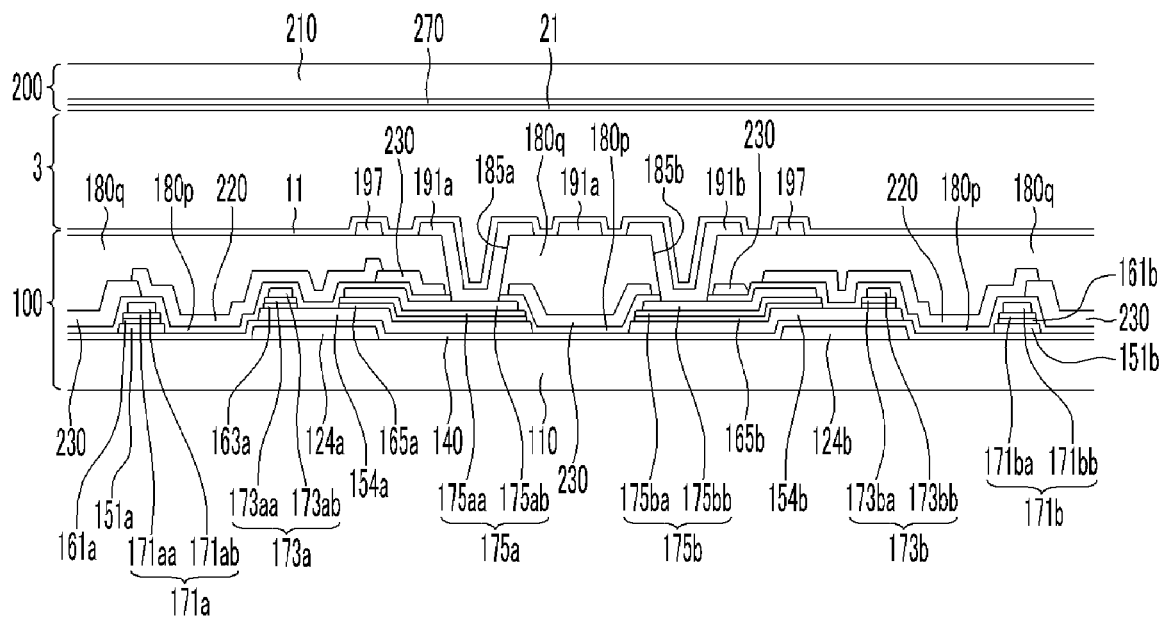
FIG. 17 shows a cross-sectional view along line XVII-XVII of the liquid crystal display shown in FIG. 16.

FIG. 16 is a layout view of a liquid crystal display according to an exemplary embodiment of the present invention, and FIG. 17 is a cross-sectional view along line XVII-XVII of the liquid crystal display shown in FIG. 16.

Referring to FIG. 16 and FIG. 17, a liquid crystal display according to the exemplary embodiment of the present invention includes a lower display panel 100 and an upper display panel 200 opposing each other with a liquid crystal layer 3 interposed between the upper and lower display panels 100 and 200.

The lower display panel 100 is described first.

A plurality of gate lines 121 and a plurality of storage electrode lines 131 and 135 are formed on the insulating substrate 110.

The gate line 121 transfers gate signals and mainly extends in a horizontal direction. The gate line 121 includes a plurality of first gate electrodes 124a and a plurality of second gate electrodes 124b upwardly protruding from the gate line 121 and a downwardly protruding portion 122.

The storage electrode lines include a stem 131 extending substantially parallel with the gate line 121 and a storage electrode 135 having a ring shape. A part of the storage electrode 135 has an expanded width. The shape and position of the storage electrode lines 131 and 135 may be modified in several ways.

The gate insulating layer 140 is formed on the gate line 121 and the storage electrode lines 131 and 135. A plurality of semiconductors 151a, 151b, 154a, and 154b that may be made of, e.g., amorphous or crystalline silicon are formed on the gate insulating layer 140.

A plurality of pairs of ohmic contacts 161a, 161b, 163a, 163b, 165a, and 165b are formed on the semiconductors 151a, 151b, 154a, and 154b. The ohmic contacts 161a, 161b, 163a, 163b, 165a, and 165b may be made of a material such as n+ hydrogenated amorphous silicon doped with a high-concentration of a silicide or an n-type impurity.

Pairs of data lines 171a and 171b, pairs of first source electrodes 173a and second source electrodes 173b, and pairs of first drain electrodes 175a and second drain electrodes 175b are formed on the ohmic contacts 161a, 161b, 163a, 163b, 165a, and 165b and on the gate insulating layer 140.

The data lines 171a and 171b, the first source electrode 173a, the second source electrode 173b, the first drain electrode 175a, and the second drain electrode 175b have a double layer of lower layers 171aa, 171ba, 173aa, 173ba, 175aa, and 175ba and upper layers 171ab, 171bb, 173ab, 173bb, 175ab, and 175bb. The lower layer may be made of titanium, and the upper layer may be made of copper although other suitable conductors may be used as well.

The data lines 171a and 171b transfer data signals and mainly extends in a vertical direction to intersect with the gate line 121 and the stem line 131 of the storage electrode line. The data lines 171a and 171b include the first source electrode 173a and the second source electrode 173b having a U-shape on the first gate electrode 124a and the second gate electrode 124b. The first source electrode 173a and the second source electrode 173b face the first drain electrode 175a and the second drain electrode 175b with respect to the first gate electrode 124a and the second gate electrode 124b.

The first source electrode 173a and the second source electrode 173b respectively partially surround one end of the first drain electrode 175a and one end of the second drain electrode 175b. The first drain electrode 175a and the second drain electrode 175b extend vertically and terminate with portions having a wider area that may connect with other layers.

In addition to the first drain electrode 175a and the second drain electrode 175b, the shape and position of the data lines 171a and 171b may be modified in various types.

The first gate electrode 124a, the first source electrode 173a, and the first drain electrode 175a form a first thin film transistor (TFT) Qa together with the first semiconductor 154a. Similarly, the second gate electrode 124b, the second source electrode 173b, and the second drain electrode 175b form the TFT Qb together with the second semiconductor 154b.

A channel of the first TFT Qa is formed in the first semiconductor 154a between the first source electrode 173a and the first drain electrode 175a. A channel of the second TFT Qb is formed in the second semiconductor 154b between the second source electrode 173b and the second drain electrode 175b.

The ohmic contacts 161a, 161b, 163a, 163b, 165a, and 165b are arranged between the semiconductors (151a, 151b, 154a, and 154b) and the data lines (171a and 171b), the source electrodes (173a and 173b), and the drain electrodes (175a and 175b) to lower the contact resistance between the semiconductors (151a, 151b, 154a, and 154b) and these items. The semiconductors 154a and 154b include exposed portions that are not covered with the data lines 171a and 171b and the drain electrodes 175a and 175b in addition to between the source electrodes 173a and 173b and the drain electrodes 175a and 175b.

A lower passivation layer 180p, which may be made of silicon nitride or silicon oxide, is formed on the data lines 171a and 171b, the source electrodes, 173a and 173b, the drain is electrodes 175a and 175b, and the exposed portions of the semiconductors 154a and 154b.

The color filter 230 is formed on the lower passivation layer 180p so that it is arranged along the length direction of the pixel. The color filter 230 may be formed by using photolithography or inkjet printing. When the color filter 230 is formed by inkjet printing, a barrier such as a rib that confines the color filter may be formed.

A light blocking member 220 preventing light leakage between color filters 230 is formed in the region in which the color filter 230 is not formed. The light blocking member 220 is formed along the data lines 171a and 171b and includes a portion corresponding to the thin film transistor. Although the present exemplary embodiment does not form the light blocking member overlapping the gate line 121, it may include the instance where the light blocking member 220 overlaps the gate line 121. In the present exemplary embodiment, the light blocking member 220 is formed on the insulating substrate 210 of lower display panel 100, and it may include formation of the light blocking member 220 on the upper substrate 210 of the upper display panel 200.

The upper passivation layer 180q is formed on the light blocking member 220 and the color filter 230. The upper passivation layer 180q may be made of an inorganic insulator or an organic insulator, or the like, and its surface may be planar. An example of the inorganic insulator may include silicon nitride and silicon oxide. The organic insulator may have photosensitivity and a dielectric constant of about 4.0 or less. A pixel electrode 191 is formed on the passivation layer 180q.

The pixel electrode 191 includes a first sub-pixel electrode 191a and a second sub-pixel electrode 191b separated from each other, having the gap 95 therebetween. The gap 95 overlaps with the storage electrode 135, thereby preventing the light leakage due to the gap 95. The gap 95 may be bent according to the shape of the texture produced by light passing through the liquid crystal layer. The upper and lower portions of two sub-pixel electrodes 191a and 191b are coupled with each other by a bent portion, and the gap 95 surrounds the periphery of the first sub-pixel 191a and forms the inner-most boundary of the second sub-pixel 191b.

The lower edge of the first sub-pixel electrode 191a is concavely formed along the boundary line between the first drain electrode 175a and the second drain electrode 175b in substantially a quadrangular shape.

The first sub-pixel electrode 191a includes a protruding portion 195a that protrudes towards the first drain electrode 175a, and the protruding portion 195a is physically and electrically connected to the first drain electrode 175a through the contact hole 185a.

The second sub-pixel electrode 191b includes a pair of branches 196 extending along the data lines 171a and 171b. The branch 196 is positioned between the first sub-pixel electrode 191a and the data lines 171a and 171b and is connected to the lower end of the first sub-pixel electrode 191a by the connection portion 197. Therefore, the first sub-pixel electrode 191a is surrounded by the second sub-pixel electrode 191b, the branch 196, and the connection portion 197. One of two branches of the second sub-pixel electrode 191b includes a protruding portion 195b, wherein the protruding portion 195b is physically and electrically connected to the second drain electrode 175b through the contact hole 185b.

The area occupied by the second sub-pixel electrode 191b may be larger than the area occupied by the first sub-pixel electrode 191a. In this case, the area of the second sub-pixel electrode 191b may be 1.0 to 2.2 times greater than the area of the first sub-pixel electrode 191a.

The upper boundary line of the second sub-pixel electrode 191b overlaps with the protruding portion 122 of a previous gate line.

An alignment layer 11 is formed on the pixel electrode 191.

Next, the upper display panel 200 is described.

In the upper display panel 200, a common electrode 270 is formed over a transparent insulating substrate 210, and an alignment layer 21 is formed on the common electrode 270.

A method for manufacturing the thin film transistor array panel shown in FIG. 16 and FIG. 17 according to the exemplary embodiment of the present invention will be described with reference to FIG. 18, FIG. 19, FIG. 20, FIG. 21, FIG. 22, and FIG. 23.

FIG. 18, FIG. 19, FIG. 20, FIG. 21, FIG. 22, and FIG. 23 sequentially show cross-sectional views along line XVII-XII of the thin film transistor of FIG. 16 during stages of its manufacture.

Figure 18:
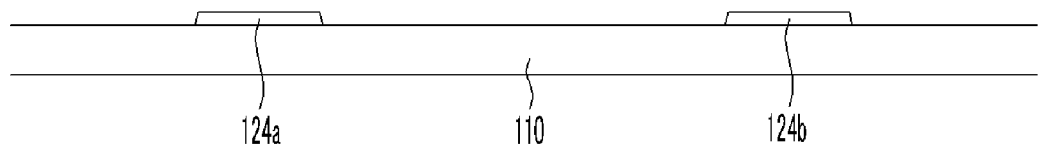
FIG. 18, FIG. 19, FIG. 20, FIG. 21, FIG. 22, and FIG. 23 sequentially show cross-sectional views along line XVII-XII of the thin film transistor of FIG. 16 during stages of its manufacture.

As shown in FIG. 18, the metal layer is formed on the insulating substrate 110, which may be made of materials such as transparent glass or plastic, and the metal layer is then patterned, thereby forming the gate line having the first and second gate electrodes 124a and 124b.

Figure 19:
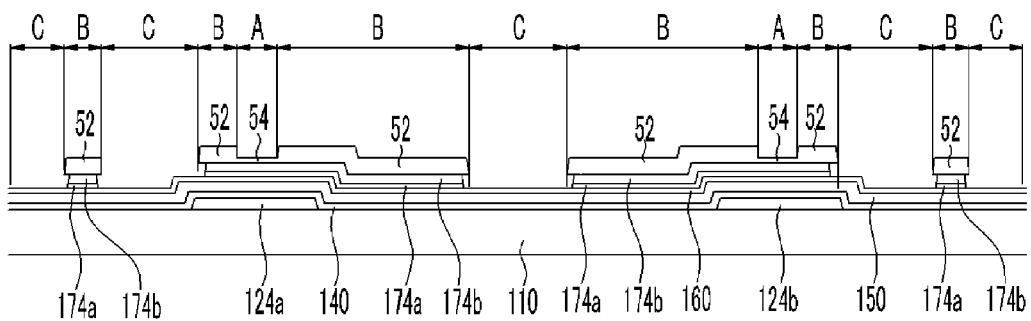

As shown in FIG. 19, the gate insulating layer 140, the first amorphous silicon layer 150, the second amorphous silicon layer 160, the first conductive layer, and the second conductive layer are stacked on the gate line having the gate electrodes 124a and 124b. The conductive impurity may be doped on the second amorphous silicon layer 160, and the first conductive layer may be made of titanium. The second conductive layer may be made of copper. Additionally, besides titanium and copper, various other conductive materials may be used for the first conductive layer and the second conductive layer.

Thereafter, a photoresist is applied to the second conductive layer, exposed, and is developed to form the photoresist patterns 52 and 54 having different thicknesses.

Thereafter, the second metal layer and the first metal layer of the remaining portion C are etched using the photoresist patterns 52 and 54 as a mask, thereby forming the second metal pattern 174b and the first metal pattern 174a.

Etching is performed and may be wet etching, thereby making it possible to form the undercut below the photoresist pattern 52 and 54.

Thereafter, the first pre-processing is performed to prevent corrosion of the side wall of the exposed second metal pattern 174b. The first pre-processing exposes the second metal pattern 174b to a pre-processing gas atmosphere. The pre-processing gas may be $SF_6$ or a mixing of $SF_6$ and He. Pre-processing may be performed for about 10 seconds.

When pre-processing gas including $SF_6$ and He is used as in the present exemplary embodiment, the gases do not have an effect on the photoresist patterns 52 and 54 so that the width and the thickness of the photoresist patterns 52 and 54 are not reduced.

Therefore, since the thin portion of photoresist pattern 54 is not removed by pre-processing gases, the second metal pattern 174b is not exposed to the gases. However, the second metal pattern reacts with the gas used during subsequent processes such that the impurity does not occur.

Figure 20:
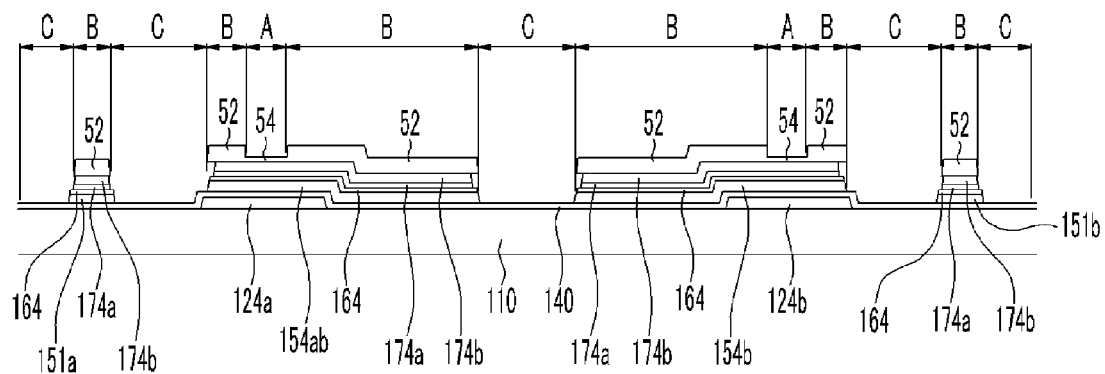

Next, as shown in FIG. 20, the second amorphous silicon layer 150 and the first amorphous silicon layer 160 of the remaining portion C are etched using the photoresist patterns 52 and 54 as a mask, thereby forming the amorphous silicon pattern 164 and semiconductors 151a, 151b, 154a, and 154b. In this case, the etching may be dry etching.

Figure 21:
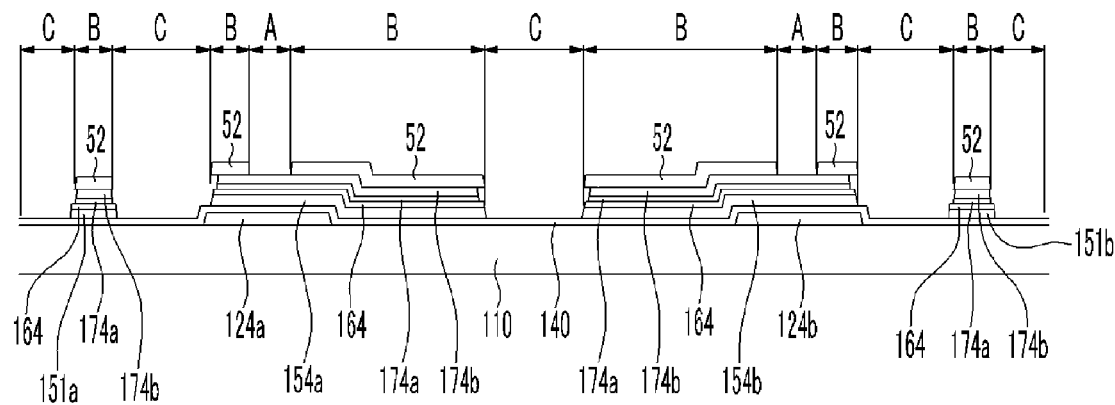

Next, as shown in FIG. 21, the photoresist pattern 54 corresponding to the channel portion A is removed by an etch back. In this case, the photoresist pattern 52 is partially removed such that the thickness and width of the photoresist pattern 52 are reduced.

Thereafter, post-processing is performed to prevent the pollution of the channel portion of the thin film transistor due to the impurity at the time of the etch back. The impurity hinders the etching during the subsequent process and results in the desired pattern not being etched. However, as in the present exemplary embodiment, the impurity is removed by post-processing, thereby making it possible to minimize the etching defect of the subsequent process.

Post-processing uses gas mixtures that may contain $SF_6$ and $O_2$, with a ratio of $SF_6:O_2$ being greater than or equal to 1:20. More specifically, the ratio of $SF_6$ to $O_2$ is greater than or equal to 1/20 and less than 1.

Figure 22:
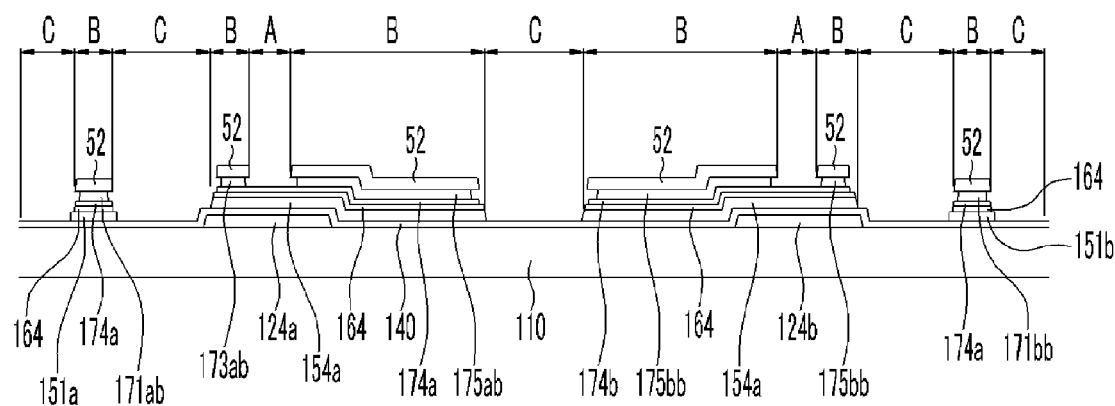

Next, as shown in FIG. 22, the upper layers 171ab, 171bb, 173ab, 175ab, 173bb, and 175bb of the data wire are formed by performing wet etching on the second metal pattern 174b using the photoresist pattern 52 as a mask.

Thereafter, second pre-processing is performed by the same method as the first pre-processing. The second pre-processing may be omitted if necessary.

Figure 23:
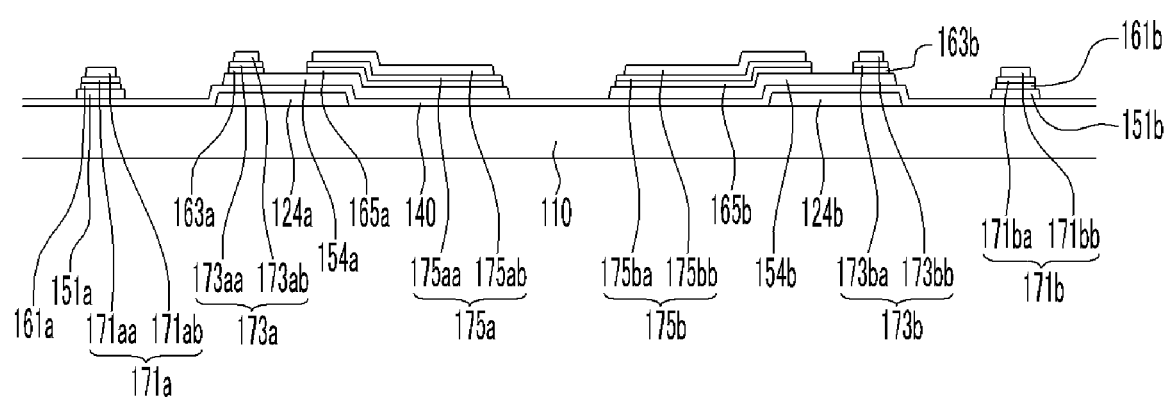

Next, as shown in FIG. 23, the first metal pattern 174a and amorphous silicon pattern 164 are etched by using the photoresist pattern 52 as the mask, thereby forming the lower layers 171aa, 171ba, 173aa, 173ba, 175aa, and 175ba of the data wire and the ohmic contacts 161a, 161b, 163a, 163b, 165a, and 165b.

Next, as shown in FIG. 17, the lower passivation layer 180p is formed to cover the exposed portion of the protruding portion 154 of the semiconductor, and the color filter 230 is formed on portions of the lower passivation layer 180p.

Thereafter, the light blocking member 220 is formed in a region in which the color filter 230 is not formed, and then the upper passivation layer 180q is formed. The contact is holes 185a and 185b are formed by etching the upper passivation layer 180q and the lower passivation layer 180p. The pixel electrode 191 having the first and second sub-pixels 191a and 191b respectively contacting the drain electrodes 175a and 175b is formed on the passivation layer 180q through the contact holes 185a and 185b.

While this invention has been described in connection with exemplary embodiments, it will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A method for manufacturing a thin film transistor array panel, the method comprising:
   forming a gate line comprising a gate electrode on a substrate;
   forming a gate insulating layer on the gate line;
   forming a first amorphous silicon layer, a second amorphous silicon layer, a first metal layer, and a second metal layer on the gate insulating layer;
   forming a photoresist pattern having a first portion and a second portion on the second metal layer, the thickness of the second portion being greater than the thickness of the first portion;
   forming a second metal pattern and a first metal pattern by respectively etching the second metal layer and the first metal layer using the photoresist pattern as a mask;
   processing the first metal pattern with $SF_6$ or a gas mixture comprising $SF_6$ and He;
   forming an amorphous silicon pattern and a semiconductor pattern by respectively etching the second amorphous silicon layer and the first amorphous silicon layer using the photoresist pattern as a mask;
   removing the first portion of the photoresist pattern;
   forming an upper layer of a data wire by wet etching the second metal pattern using the second portion as a mask;
   forming a lower layer of the data wire and an ohmic contact, respectively, by etching the first metal pattern and the amorphous silicon pattern using the second portion as a mask;
   forming a passivation layer comprising a contact hole on the upper layer after removing the second portion; and
   forming a pixel electrode on the passivation layer, the pixel electrode being connected to the upper layer through the contact hole.

2. The method of claim 1, wherein processing the first metal pattern is performed for about 10 seconds.

3. The method of claim 1, wherein, during removing the first portion of the photoresist pattern, a gas mixture of $SF_6$ and $O_2$ is used.

4. The method of claim 3, wherein the ratio of SF6 to O2 is greater than or equal to 1/20 and less than 1.

5. The method of claim 1, wherein the upper layer and the lower layer form a data line comprising a source electrode and a drain electrode facing the source electrode, and
   the first portion is disposed at a position corresponding to a channel portion between the source electrode and the drain electrode.

6. The method of claim 1, wherein the first metal layer comprises titanium, and the second metal layer comprises copper.

7. The method of claim 1, wherein wet etching the second metal layer forms an undercut below the photoresist pattern.

8. The method of claim 1, wherein forming the lower layer and the ohmic contact is performed by dry etching.

9. A method for manufacturing a thin film transistor array panel, the method comprising:
- forming a gate line comprising a gate electrode on a substrate;
- forming a gate insulating layer on the gate line;
- forming a first amorphous silicon layer, a second amorphous silicon layer, a first metal layer, and a second metal layer on the gate insulating layer;
- forming a photoresist pattern having a first portion and a second portion on the second metal layer, the thickness of the second portion being greater than the thickness of the first portion;
- forming a second metal pattern and a first metal pattern by respectively etching the second metal layer and the first metal layer using the photoresist pattern as a mask;
- forming an amorphous silicon pattern and a semiconductor pattern by respectively etching the second amorphous silicon layer and the first amorphous silicon layer using the photoresist pattern as a mask;
- removing the first portion of the photoresist pattern;
- forming an upper layer of a data wire by wet etching the second metal pattern using the second portion as a mask;
- forming a lower layer of the data wire and an ohmic contact, respectively, by etching the first metal pattern and the amorphous silicon pattern using the second portion as a mask;
- forming a passivation layer comprising a contact hole on the upper layer after removing the second portion; and
- forming a pixel electrode on the passivation layer, the pixel electrode being connected to the upper layer through the contact hole,
- wherein the first portion of the photoresist pattern is removed using a gas mixture of $SF_6$ and $O_2$.

10. The method of claim 9, wherein the gas mixture has the ratio of SF6 to O2 is greater than or equal to 1/20 and less than 1.

11. The method of claim 9, wherein the upper layer and the lower layer form a data line comprising a source electrode and a drain electrode facing the source electrode, and
- the first portion is disposed at a position corresponding to a channel portion between the source electrode and the drain electrode.

12. The method of claim 9, wherein the first metal layer comprises titanium, and the second metal layer comprises copper.

13. The method of claim 9, wherein wet etching the second metal layer forms an undercut below the photoresist pattern.

14. The method of claim 9, wherein forming the lower layer and the ohmic contact is performed by dry etching.

15. A method for manufacturing a thin film transistor array panel, the method comprising:
- forming a gate line comprising a gate electrode on a substrate;
- forming a gate insulating layer on the gate line;
- forming a first amorphous silicon layer, a second amorphous silicon layer, a first metal layer, and a second metal layer on the gate insulating layer;
- forming a photoresist pattern having a first portion and a second portion on the second metal layer, the thickness of the second portion being greater than the thickness of the first portion;
- forming a second metal pattern and a first metal pattern by respectively etching the second metal layer and the first metal layer using the photoresist pattern as a mask;
- forming an amorphous silicon pattern and a semiconductor pattern by respectively etching the second amorphous silicon layer and the first amorphous silicon layer using the second portion as a mask;
- removing the first portion;
- cleaning surfaces exposed by removal of the first portion with a gas mixture comprising $O_2$ and He;
- forming an upper layer of a data wire by wet etching the second metal pattern using the second portion as a mask;
- forming a lower layer of the data wire and an ohmic contact, respectively, by etching the first metal pattern and amorphous silicon pattern using the second portion as a mask;
- forming a passivation layer comprising a contact hole on the upper layer after removing the second portion; and
- forming a pixel electrode on the passivation layer, the pixel electrode being connected to the upper layer through the contact hole.

16. The method of claim 15, wherein cleaning the exposed surfaces injects $O_2$ at a flow rate ranging from 500 sccm to 15,000 sccm and He at a flow rate of 1000 sccm.

17. The method of claim 15, further comprising, after forming the first metal pattern, processing the first metal pattern with $SF_6$ or a gas mixture comprising $SF_6$ and He.

18. The method of claim 15, wherein the upper layer and the lower layer form a data line comprising a source electrode and a drain electrode facing the source electrode, and
- the first portion is disposed at a position corresponding to a channel portion between the source electrode and the drain electrode.

19. The method of claim 15, wherein the first metal layer comprises titanium, and the second metal layer comprises copper.

20. The method of claim 15, wherein wet etching the second metal layer forms an undercut below the photoresist pattern.

21. The method of claim 15, wherein forming the lower layer and the ohmic contact is performed by dry etching.

22. A method of reducing impurity defects during manufacture of a thin film transistor array panel, the method comprising:
- providing a gate line on a substrate, a gate insulating layer on the gate line, at least one silicon-containing layer on the gate insulating layer, at least one metal layer on the at least one silicon-containing layer, and a photoresist pattern on the at least one metal layer;
- forming a metal pattern by etching the at least one metal layer using the photoresist pattern as a mask;
- subjecting the metal pattern to gas mixture comprising $SF_6$;
- forming a silicon-containing pattern by etching the at least one silicon-containing layer using the photoresist pattern as a mask;
- removing a first portion of the photoresist pattern;
- cleaning surfaces that were exposed by removing the first portion with a gas mixture of $SF_6$ and $O_2$;
- forming a conductive wire by wet etching the metal pattern using a remaining portion of the photoresist pattern as a mask;

forming a semiconductor pattern by etching the silicon-containing pattern using the remaining portion as a mask;

forming a passivation layer comprising a contact hole on the conductive wire after removing the remaining portion; and forming a pixel electrode on the passivation layer, the pixel electrode being connected to the conductive wire through the contact hole.

23. The method of claim 22, wherein subjecting the metal pattern is performed for about 10 seconds.

24. The method of claim 22, wherein, during cleaning, the gas mixture of SF6 and O2 has the ratio of SF6 to O2 is greater than or equal to 1/20 and less than 1.

25. The method of claim 22, wherein the conductive wire comprises a source electrode and a drain electrode facing the source electrode, and the first portion is disposed at a position corresponding to a channel portion between the source electrode and the drain electrode.

26. The method of claim 22, wherein the metal layer comprises a metal selected from titanium and copper.

27. The method of claim 22, wherein wet etching the metal layer forms an undercut below the photoresist pattern.

28. The method of claim 22, wherein forming the semiconductor pattern is performed by dry etching.

* * * * *